(12) United States Patent
Ham

(10) Patent No.: US 7,952,796 B2
(45) Date of Patent: May 31, 2011

(54) QUANTUM OPTICAL DATA STORAGE

(75) Inventor: Byoung-Seung Ham, Incheon (KR)

(73) Assignee: Inha-Industry Partnership Institute, Incheon (KR)

( * ) Notice: Subject to any disclaimer, the term of this patent is extended or adjusted under 35 U.S.C. 154(b) by 251 days.

(21) Appl. No.: 12/274,639

(22) Filed: Nov. 20, 2008

(65) Prior Publication Data

US 2010/0034007 A1 Feb. 11, 2010

(30) Foreign Application Priority Data

Aug. 5, 2008 (KR) .................. 10-2008-0076678

(51) Int. Cl.
*G02F 1/35* (2006.01)
*G11C 13/00* (2006.01)
*G11C 13/04* (2006.01)
(52) U.S. Cl. .................. 359/326; 365/106; 365/215
(58) Field of Classification Search .................. None
See application file for complete search history.

(56) References Cited

U.S. PATENT DOCUMENTS 6,680,860 B1 * 1/2004 Merkel et al. .................. 365/119

FOREIGN PATENT DOCUMENTS

| JP | 06-051457 | 2/1994 |
| JP | 2722631 | 11/1997 |

OTHER PUBLICATIONS

Ham, et al., "Spin Coherence Excitation and Rephasing with Optically Shelved Atoms," The American Physical Society, vol. 58, No. 18, Nov. 1, 1998.
Nilsson, et al., "Solid State Quantum Memory Using complete Absorption and Re-emission of Photons by Tailored and Externally Controlled Inhomogeneous Absorption Profiles," Optics Communications 247 (2005), Sep. 10, 2004.
English Translation of Abstract of JP06051457, published on Feb. 25, 1994.
English Translation of Abstract of JP2252123, published on Sep. 10, 1990 (also published as JP2722631).
Notice of Allowance Jun. 28, 2010, Korean Patent Application No. KR 10-2008-0076678.

* cited by examiner

*Primary Examiner* — Hemang Sanghavi
(74) *Attorney, Agent, or Firm* — Vierra Magen Marcus & DeNiro LLP

(57) ABSTRACT

The present invention provides a quantum optical data storage protocol, whose storage time is lengthened by spin population decay time from several minutes to several hours. The quantum data storage includes a first ground state and a second ground state which are closely spaced each other in energy level or degenerated and to forbid two-photon transitions between the first and second ground states; an excited state which has a spin inhomogeneous broadening and to allow two-photon transitions between the first ground state and the second ground sate via the excited state and allow a spin coherence; an auxiliary state for forbidding two-photon transitions between the first and second ground states via the auxiliary state and allowing a transition from/to the excited state; wherein a spin coherence induced by a transition of two photons from the first ground state and the second state to the excited state is transited to the auxiliary state so that a phase decay of the spin coherence is prevented and data is stored as the phase of the spin coherence.

17 Claims, 7 Drawing Sheets

(a)

(b)

QUANTUM OPTICAL DATA STORAGE

RELATED APPLICATION

This application claims priority from Korean Patent Application No. 10-2008-0076678, filed on Aug. 5, 2008, which is herein expressly incorporated by reference in its entirety.

TECHNICAL FIELD

The present invention relates to a quantum optical data storage.

RELATED ART

In related art, storing data in quantum optical memory is limited by several milliseconds. Accordingly, in quantum memory area, not only retrieval efficiency but also storage time is an important issue for practical applications.

For last several years, several observations of quantum memory have been reported such as off-resonant Raman scattering, optically reversible photon echoes, and EIT (electromagnetically induced transparency)-based quantum mapping. In these quantum memory approaches, the storage time is limited by spin phase decay time: see EIT for S. E. Harris, Phys. Today. Vol. 50 (No. 7), p. 36 (1997); Phys. Rev. Lett. Vol. 62, pp. 1033-1036 (1989). In atomic media or rare-earth doped solid media, the spin phase decay time is near or less than mili-second. Regarding data retrieval efficiency, photon echo based method showed about 20% retrieval efficiency even though near perfect efficiency is possible ideally. In the EIT-based slow light quantum data storage method, the retrieval efficiency reaches up to 50% if the data pulse shape is adjusted. Unfortunately, resonant Raman scattering or EIT-based quantum memory techniques have a severe limitation in memory data rate, i.e., one bit at a time.

In a three-level optical system composed of two-closely spaced ground states, it is well known that a resonant Raman pulse can induce two-photon coherence on the two lying states. In the context of coherent population trapping or EIT the two-photon coherence is called spin coherence or dark state. Especially in a slow light regime, the dark state propagates along the optical fields as a coupled nature through the medium: see for slow light and quantum mapping, Liu, C., Dutton, Z., Behroozi, C. H., and Hau, L. V. Observation of coherent optical information storage in an atomic medium using halted light pulses. Nature 409, 490-493 (2001). Whenever, one of the two optical fields forming the resonant Raman field is turned off, the quantum information of the other field can be completely transferred into the spin coherence. This is so called quantum mapping process.

In an optically dense medium such as weak resonant optical pulse is completely absorbed by the medium, quantum mapping process does not need electromagnetically induced transparency, because spin coherence or dark state is made from two-photon transitions. spin transition of the atomic system. the refractive index change can result in not only absorption cancellation at line center but also two-photon coherence excitation on the ground levels. This phenomenon is called dark resonance or electromagnetically induced transparency (EIT) in the context of optically dense medium: S. E. Harris, Phys. Today. Vol. 50 (No. 7), p. 36 (1997); Phys. Rev. Lett. Vol. 62, pp. 1033-1036 (1989).

In the case of dark resonance or EIT, the time needed for the refractive index change is, however, not limited by the carriers' lifetime or population relaxation time, but limited by the phase decay time. Generally, the phase decay time is faster than the carrier's lifetime at least twice in most atomic gases and hundreds times in most ion-doped crystals such as $Pr^{3+}$-doped $Y_2SiO_5$. The two-photon coherence excitation on the closely spaced ground states can also be optically detected via nondegenerate four-wave mixing processes. The optical intensity of the nondegenerate four-wave mixing signals can be stronger than that of the original input laser. This signal amplification in the nondegenerate four-wave mixing processes based on EIT has already been demonstrated experimentally. The resulting intensity of the nondegenerate four-wave mixing signal can be stronger than that of the original input signal: Hemmer et al., Optics Letters, Vol. 20, pp. 982-4 (1995).

To help understanding of the present invention, photon echo optical data storage method may be introduced to explain multiple data storage and rephrasing processes.

SUMMARY

An object of the present invention is to lengthen storage time of a quantum optical data storage.

In more detail, an object of the present invention is to provide a method and apparatus of a quantum optical data storage protocol, whose storage time is lengthened by spin population decay time.

To achieve one of the objects of the present invention, as embodied and broadly described herein, there is provided a quantum data storage, including: a first ground state and a second ground state which are closely spaced each other in energy level or degenerated and to forbid two-photon transitions between the first and second ground states; an excited state which has a spin inhomogeneous broadening and to allow two-photon transitions between the first ground state and the second ground sate via the excited state and allow a spin coherence; an auxiliary state for forbidding two-photon transitions between the first and second ground states via the auxiliary state and allowing a transition from/to the excited state; wherein a spin coherence induced by a transition of two photons from the first ground state and the second state to the excited state is transited to the auxiliary state so that a phase decay of the spin coherence is prevented and data is stored as the phase of the spin coherence.

To achieve one of the objects of the present invention, as embodied and broadly described herein, there is provided a quantum data storage, including: a first ground state and a second ground state which are closely spaced each other in energy level or degenerated and to forbid two-photon transitions between the first and second ground states; an excited state which has a spin inhomogeneous broadening and to allow two-photon transitions between the first ground state and the second ground sate via the excited state thereby to produce a spin coherence; an auxiliary state for forbidding two-photon transitions between the first and second ground states via the auxiliary state and allowing a transition from/to the excited state; wherein the spin coherence in the auxiliary state is transited to the excited state and to the first and second ground state such that a phase of the spin coherence is retrieved and a light is emitted as data to be read.

To achieve one of the objects of the present invention, as embodied and broadly described herein, there is provided, a method for writing data in a quantum data storage comprising a nonlinear optical medium, the nonlinear optical medium including a first ground state and a second ground state which are closely spaced each other in energy level or degenerated and to forbid two-photon transitions between the first and second ground states, an excited state which has a spin inhomogeneous broadening and to allow two-photon transitions between the first ground state and the second ground sate via the excited state thereby to produce a spin coherence, an auxiliary state for forbidding two-photon transitions between the first and second ground states via the auxiliary state and allowing a transition from/to the excited state;

and the method comprising: a) applying, to the nonlinear optical medium, a first laser beam having a first frequency corresponding to the transition from the first ground state to the excited state, and a second laser beam having a second frequency corresponding to the transition from the second ground state to the excited state such that the transitions produces a spin coherence; b) applying, to the nonlinear optical medium, a third laser beam having a third frequency corresponding to a transition from the excited state to the auxiliary state, wherein a phase decay of the spin coherence is prevented and data is stored as the phase of the spin coherence.

To achieve one of the objects of the present invention, as embodied and broadly described herein, there is provided a method for reading data from a quantum data storage comprising a nonlinear optical medium, the nonlinear optical medium including a first ground state and a second ground state which are closely spaced each other in energy level or degenerated and to forbid two-photon transitions between the first and second ground states, an excited state which has a spin inhomogeneous broadening and to allow two-photon transitions between the first ground state and the second ground sate via the excited state thereby to produce a spin coherence, an auxiliary state for forbidding two-photon transitions between the first and second ground states via the auxiliary state and allowing a transition from/to the excited state;

and the method comprising:

a) applying, to the nonlinear optical medium, a third laser beam having a third frequency corresponding to the transition from the auxiliary state to the excited, wherein a phase of a spin coherence reserved in the auxiliary state is retrieved; b) applying, to the nonlinear optical medium, a first laser beam having a first frequency corresponding to the transition from the excited state to the first ground state, and a second laser beam having a second frequency corresponding to the transition from the excited state to the second ground state; c) applying, to the nonlinear optical medium, the second laser beam such that a nondegenerate four-wave mixing signal is emitted; and d) analyzing the nondegenerate four-wave mixing wave corresponding the data to be read.

To achieve one of the objects of the present invention, as embodied and broadly described herein, there is provided a quantum data storage, comprising: a nonlinear optical medium including a first ground state and a second ground state which are closely spaced each other in energy level or degenerated and to forbid two-photon transitions between the first and second ground states, an excited state which has a spin inhomogeneous broadening and to allow two-photon transitions between the first ground state and the second ground sate via the excited state thereby to produce a spin coherence, an auxiliary state for forbidding two-photon transitions between the first and second ground states via the auxiliary state and allowing a transition from/to the excited state; a first controlling unit for controlling applying a first laser beam having a first frequency corresponding to the transition between the first ground state and the excited state; a second controlling unit for controlling applying a second laser beam having a second frequency corresponding to the transition between the second ground state and the excited state; a third controlling unit for controlling applying a third laser beam having a third frequency corresponding to the transition between the excited state and the auxiliary state; wherein a spin coherence produced from a transition of two photons from the first ground state and the second state to the excited state by appliance of the first laser beam and the second laser beam is transited to the auxiliary state so that a phase decay of the spin coherence is prevented and data is stored as the phase of the spin coherence, and wherein the spin coherence in the auxiliary state is transited to the excited state and to the first and second ground state by appliance of the third laser beam such that a phase of the spin coherence is retrieved and the spin coherence is transited to the first and second ground states by appliances of the first laser beam and second laser beam such that a four-wave mixing signal is produced as data to be read.

BRIEF DESCRIPTION OF DRAWINGS

The accompanying figures illustrate several embodiments of the present invention, and together with the descriptions, serve to explain the principles of the invention. The drawings are for only for the purpose of illustrating a preferred embodiment of the invention and are not to be construed as limiting the invention.

DETAILED DESCRIPTION

Figure 1:
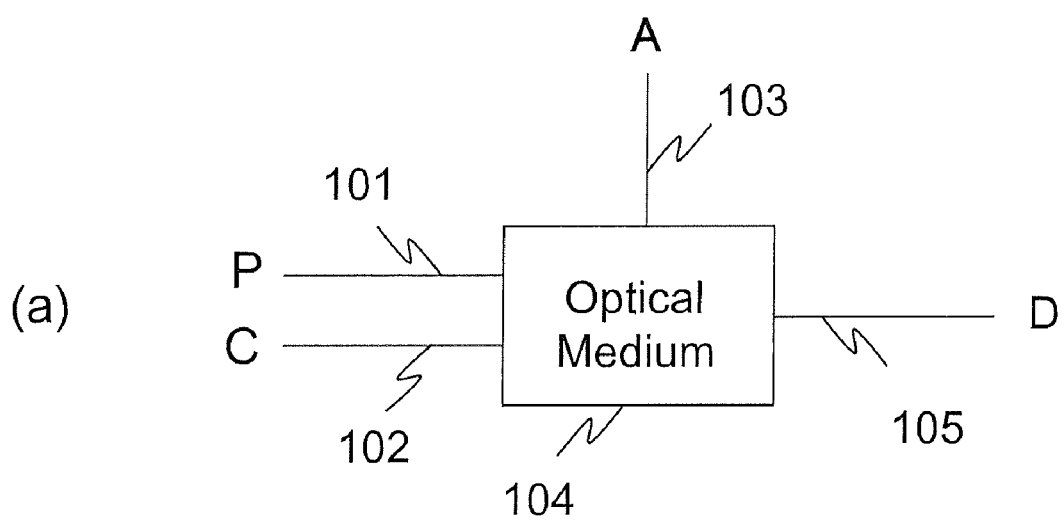
FIG. 1 illustrates a reversible quantum optical memory according to the present invention and an energy level thereof.
Figure 1:
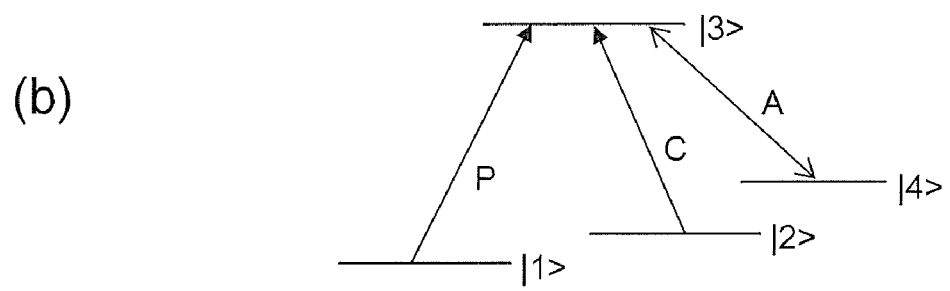

Reference will now be made in detail to some embodiments, examples of which are illustrated in the accompanying drawings.

Though the present teachings may be variously modified and have several embodiments, specific embodiments will be shown in drawings and be explained in detail. However, the present teachings are not meant to be limited, but it is intended that various modifications, equivalents, and alternatives are also covered within the scope of the claims.

Although terms of 'first', 'second', etc. are used to explain various components, the components are not limited to such terms. These terms are used only to distinguish one component from another component. For example, a first component may be referred to as a second component, or similarly, the second component may be referred to as the first component within the scope of the present invention.

The term 'and/or' is used to include a combination of a plurality of disclosed items or one of the items.

When it is mentioned that one component is "connected" or "accessed" to another component, it may be understood that the one component is directly connected or accessed to the another component or that still other component is interposed between the two components.

Also, when it is mentioned that one component is "directly connected" or "directly accessed" to another component, it may be understood that no component is interposed therebetween.

Terms used herein are to merely explain certain embodiments, not meant to limit the scope of the present invention.

A singular expression includes a plural concept unless there is a contextually distinctive difference therebetween. In this description, the term "include" or "have" is intended to indicate that characteristics, numbers, steps, operations, components, elements, etc. disclosed in the specification or combinations thereof exist. As such, the term "include" or "have" should be understood that there are additional possibilities of one or more other characteristics, numbers, steps, operations, components, elements or combinations thereof.

Unless specifically defined, all the terms used herein including technical or scientific terms have the same meaning as terms generally understood by those skilled in the art.

Terms defined in a general dictionary should be understood so as to have the same meanings as contextual meanings of the related art. Unless definitely defined in the present invention, the terms are not interpreted as ideal or excessively formal meanings.

Hereinafter, certain embodiments of the present invention will be explained in more detail with reference to the attached drawings. The same component or components corresponding to each other will be provided with the same reference numeral, and their detailed explanation will be omitted. Hereinafter, the term of 'content' will be described.

To gain a better understanding, prior to explaining the drawings, a concept of the present invention is now explained.

The rephrasing mechanism is gives a main physics to the echo-type quantum memory, where reversible inhomogeneous broadening is utilized for phase coherence. Because there are many atoms which the laser fields are interact, these atoms can act as a storage medium of the phase information of the applied optical field. Regardless of the number of data pulses, the phase and amplitude of the two-photon coherence (dark state) is recorded on the spin emsemble. Here it should be noted that each atom has its own spin broadening. Thus even for the atoms whose homogeneous decay rate is same to the applied optical fields, the spin decay rate can be different. That means, for example, two consecutive resonant Raman pulses can excite different spin coherence on the spin broadening. If the stored spin coherence can be retrieved it satisfies quantum memory. To retrieve the excited spin coherence a rephrasing pulse is required. This is because all detuned spins should evolve with it's own detuning at different phase velocity. Thus, the dephasing time depends on how many atoms (spins) are involved. If one can make the dephasing evolution reversed, the initial spin coherence can be retrieved. In a photon echo method, the rephrasing pulse is an optical p pulse. In an electro-optic rephrasing method, electrical voltage is used for direct spin coherence reversal. In the present method, we use a resonant 2 p Raman pulse to make the spin coherence evolution reversed.

As in the $\pi/2$-$\pi/2$ stimulated photon echo method (see Mossberg, T. W. Time-domain frequency-selective optical data storage. Opt. Lett. 7, 77-79 (1982), the $2\pi$ rephrasing pulse now can be split into two parts. However, unlike photon echo method based on two-level system, the present method must have a coherence leakage due to population decay from the excited state |3>. As shown in the simulation, this leakage is exponentially increases as time goes on. To solve this leakage problem is the key point in the present invention.

Briefly described, a system of the spin population decay time limited quantum optical data storage based on reversible spin inhomogeneous broadening is provided by an optically thick nonlinear medium and three coherent light sources P, C, and A: see FIG. 1. The nonlinear optical medium for the present quantum data storage is composed of at least three-energy levels |1>, |2> and |3> as shown in the inset of FIG. 1. Two ground states |1> and |2> should be closely spaced, and the third |3> should be an optically excited state. The fourth state |4> should be isolated state, so that ideally no dipole transition is allowed to the rest states. The frequencies of the laser light of C and A are either same or different depending on purposes: See FIG. 1. The light pulse A is used for a decay locking process, in which the excited atoms on state |3> is to be transferred to the fourth state |4>.

To gain a better understanding reference is now made to the drawings which illustrate the preferred embodiments of the present invention.

FIG. 1(a) describes an energy level diagram of the nonlinear optical medium 104 in FIG. 1(b). The electromagnetic fields P, C, and A stand for optical pulse whose transitions are resonant from the three sub-levels |1>, |2>, and |4> to the common excited state |3>, respectively. The numbers from 101 to 103 and 105 stand for laser beams as well as physical channels such as optical waveguides, free space, or surface plasmon waveguides used for the laser beams.

FIG. 1(b) illustrates a schematic diagram of the reversible quantum optical data storage of the present invention. Letter P (101), C (102), A (103), and D (105) stand for coherent laser light whose Rabi frequencies are, respectively, $\Omega_P$, $\Omega_C$, $\Omega_A$, and $\Omega_D$ interacting with the nonlinear optical medium 104, where the connection between laser light and the nonlinear optical medium is by optical waveguides, free space, or plasmon optical waveguide.

Figure 2:
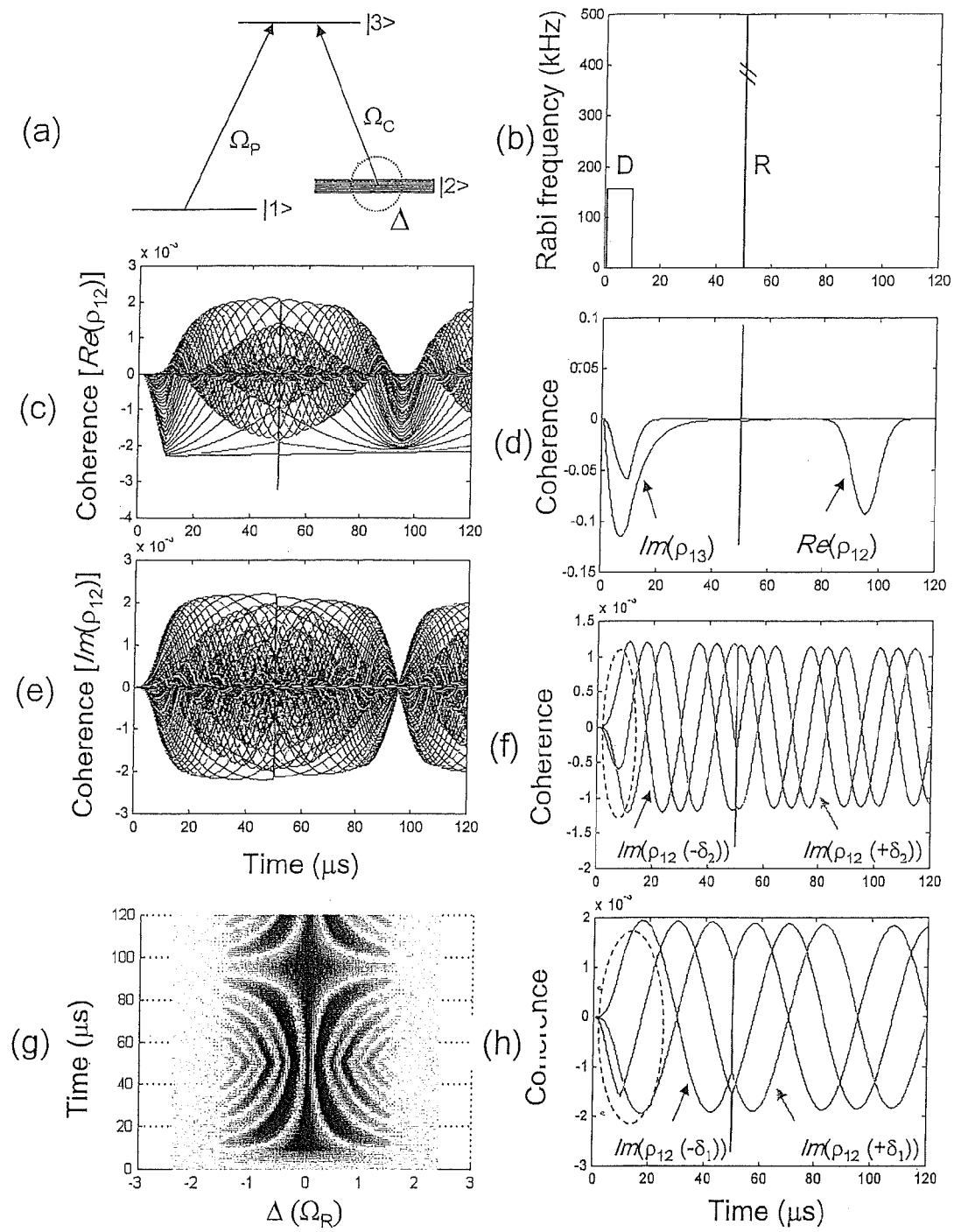
FIG. 2 illustrates numerical calculations of resonant Raman pulse excited spin coherence and the spin coherence rephrasing process.

FIG. 2 shows numerical calculations of a resonant Raman optical pulse excited spin coherence and the spin coherence retrieval by a rephrasing pulse. FIG. 2(a) shows an energy level diagram the optical medium of 104 in FIG. 1 interacting with a resonant Raman pulse. The optical medium has both optical and spin inhomogeneous broadenings. In the optical inhomogeneous broadening, a spectral selection can be made by an applied laser Rabi frequency, an applied laser jitter (or linewidth), or homogeneous decay rate of the medium whichever is biggest. We just assume an optical spectral selection is made, so that the transition from the ground sublevels to the excited state follows a (effective) homogeneous system. For the spin inhomogeneous broadening we assume state |2> is inhomogeneously broadened. Laser light $\pi P$ and $\pi C$ compose a resonant Raman pulse. Even though the resonant Raman pulse behaves resonantly to the optical transition, it has always detuning $\Delta i$ to the spin ensembles inhomogeneously broadened, where the subscript i stands for each spin in the emsemble (see FIG. 4(b).

For the numerical calculations, the spin inhomogeneous broadening is 100 kHz at full width at half maximum with a Gaussian distribution, and a total of 121 spin groups are chosen at a step of 2 kHz. The numerical parameters are from experimental values of a rare-earth Pr3+ doped Y2SiO5. FIG. 2(b) is for the resonant Raman optical pulse composed of $\Omega P$ and $\Omega C$, where D and R stand for quantum optical data and rephrasing pulse.

The pulse area $\Phi$ of the rephrasing pulse R is $\Phi = \int \Omega dt$,   (1)

where $\Omega$ is a generalized Rabi frequency of the resonant Raman pulse.

FIG. 2(c) represents each spin evolution by the action of the resonant Raman pulse D and R. As seen spin coherence Re(ρ12) is coherently excited as D applies, and freely decays at different speed. The dephasing speed is determined by the detuning Δi. Even though the dephasing speed is different, initial coherence is retrieved by the action of the rephasng pulse R. This is very similar to the photon echo technique, where optical phase is rephrased in two-level system (see Mossberg, T. W. Time-domain frequency-selective optical data storage. Opt. Lett. 7, 77-79 (1982)). This rephrasing process is time reversal process, so that the delay time between D and R determines the retrieval time:

$$TE=2T\tilde{R}TD. \quad (2)$$

FIG. 2(d) is the sum of FIG. 2(c) and optical coherence Im(ρ13). As shown the optical absorption (Im(ρ13)) induces the spin coherence excitation ((Re(ρ12)). FIG. 2(e) is for imaginary part of the excited spin coherence. Because the detuning Δ in FIG. 1(a) is symmetric, the phase evolution displays symmetric feature. FIG. 2(f) shows two spin groups in FIGS. 2(c) and 2(e). The blue curve is for real part whose value is same for symmetrically detuned spins. The importance is at the imaginary part (green and red curves). Depending on the sign of the detuning, the phase precedes or delay against of the real part (blue curve) at 90 degrees. In the red-dotted area, the real part magnitude varies zero to maximum depending on the detuning. Thus the overall coherence magnitude by D in FIG. 2(d) is always smaller than the retrieved one. However, this does not violate energy conservation, until the imaginary part (absorption, red curve) is smaller than spin retrieval.

FIG. 2(g) is 2-D display of FIG. 2(c). As shown in FIG. 2(d), the individual spin phase evolution proves rephrasing by the rephrasing pulse at t=50 μs. FIG. 2(h) shows anther set of pair of symmetric spins like in FIG. 2(f).

Figure 3:
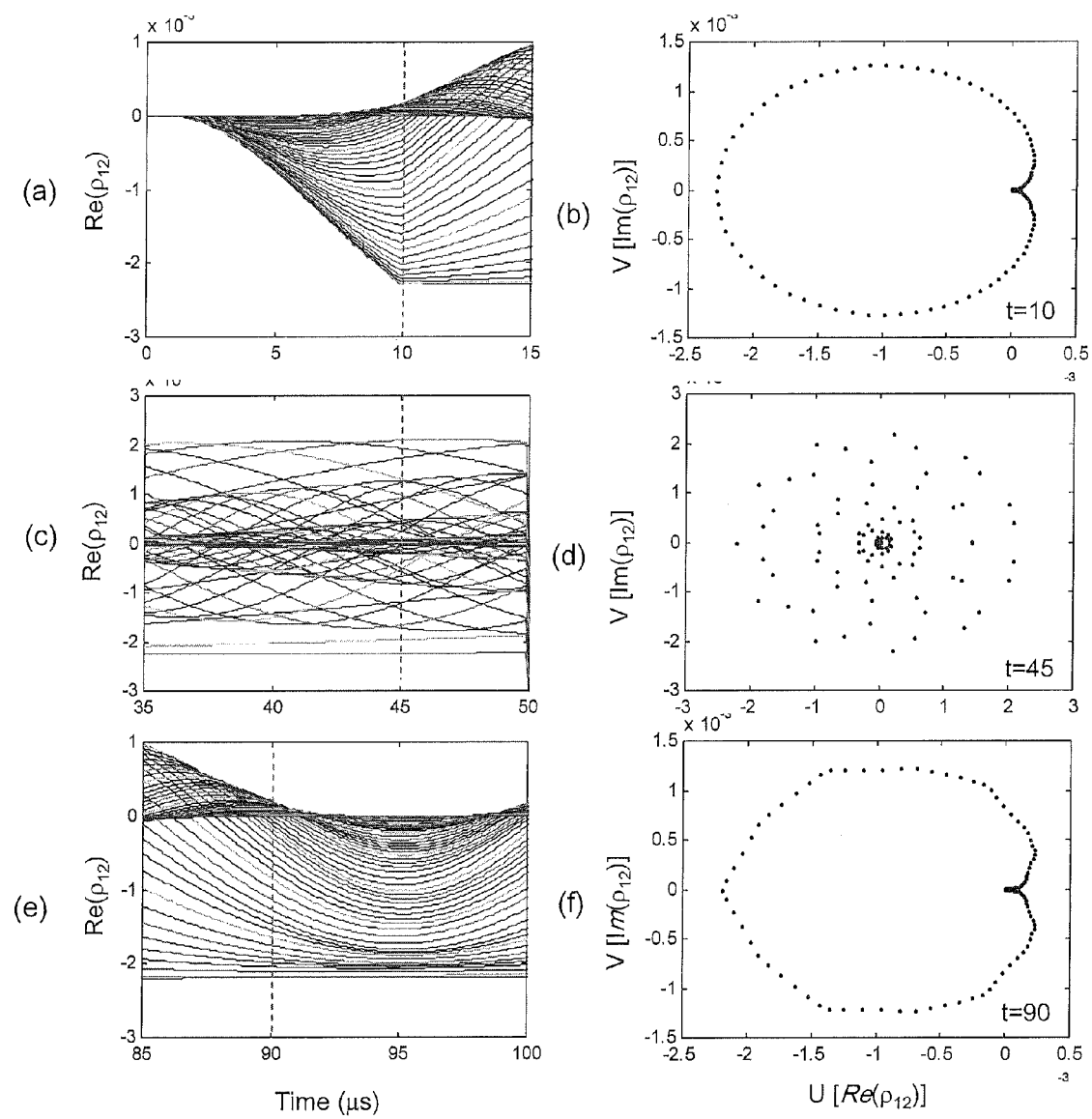
FIG. 3 illustrates numerical calculations of resonant Raman pulse excited spin coherence and the spin coherence rephrasing process using a Block vector diagram.

FIG. 3 shows uv plane of Bloch vector model for the spin coherence evolution of FIG. 2. FIG. 3(a) is for uv vector of all spins when the resonant Raman optical pulse ends at t=10 μs. The excitation of spin coherence is negative sign in Re(ρ12), where it is maximum at t=10 μs. After the resonant Raman optical pulse, the excited spin coherence decays quickly according to the spin inhomogeneous width.

This fast decay phenomenon is called spin free induction decay, and the decay time τ is an inverse of the spin inhomogeneous broadening: $\tilde{\tau}=1/\pi 105\sim 3$ μs. Thus, at t=45 μs, it is expected that the spin coherence is completely decayed out as shown in FIG. 3(d). Now the rephrasing pulse R plays a role of time reversal on the spin coherence evolution. Thus, at t=90 ms (t=2T−TD=100−10=90), a complete spin coherence retrieval is expected as shown in FIG. 3(f), which must be same as FIG. 3(b). This is a resonant Raman optical pulse excited spin coherence and retrieval, in which the physics is used for quantum optical data storage. The storage time in FIGS. 1~3 is limited by spin phase decay time as experimentally demonstrated an homogeneous spin system in atomic vapors (Lukin, PRL) ultra-cold atoms (Hau, Nature). The significance of FIGS. 1~3 is for inhomogeneous broadened spin system for quantum optical data storage (Ham, PRB, OL), where multiple optical data can be stored in comparison with homogeneously broadened spin system.

Figure 4:
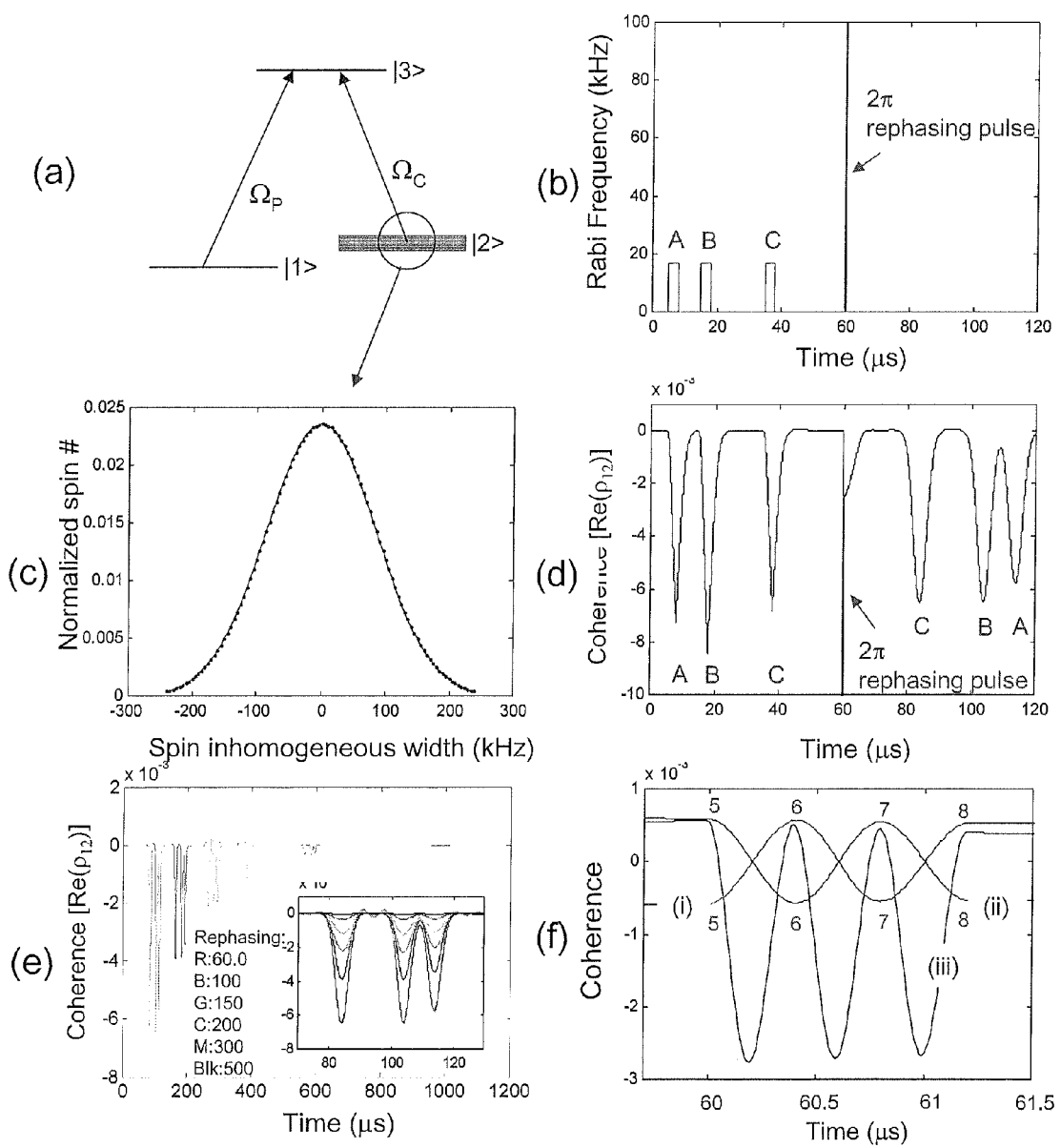
FIG. 4 illustrates numerical calculations of reversible quantum optical data storage based on reversible spin inhomogeneous broadening.

FIG. 4 shows three-consecutive optical pulse storage in the inhomogeneously broadened spin system. Letters A, B, and C stand for quantum optical data composed of resonant Raman pulse of ΩP and ΩC. The 2π rephrasing pulse is also composed of resonant Raman pulse whose pulse area is 2π and plays a role of spin phase rephrasing.

The spin inhomogeneous broadening is widened twice from 100 kHz to 200 kHz just for reducing simulation time. This is due to shortened decay time as mentioned in FIG. 3. The resonant Raman optical data pulses A, B, and C are equally balanced in Rabi frequency to ΩP and ΩC.

Figure 6:
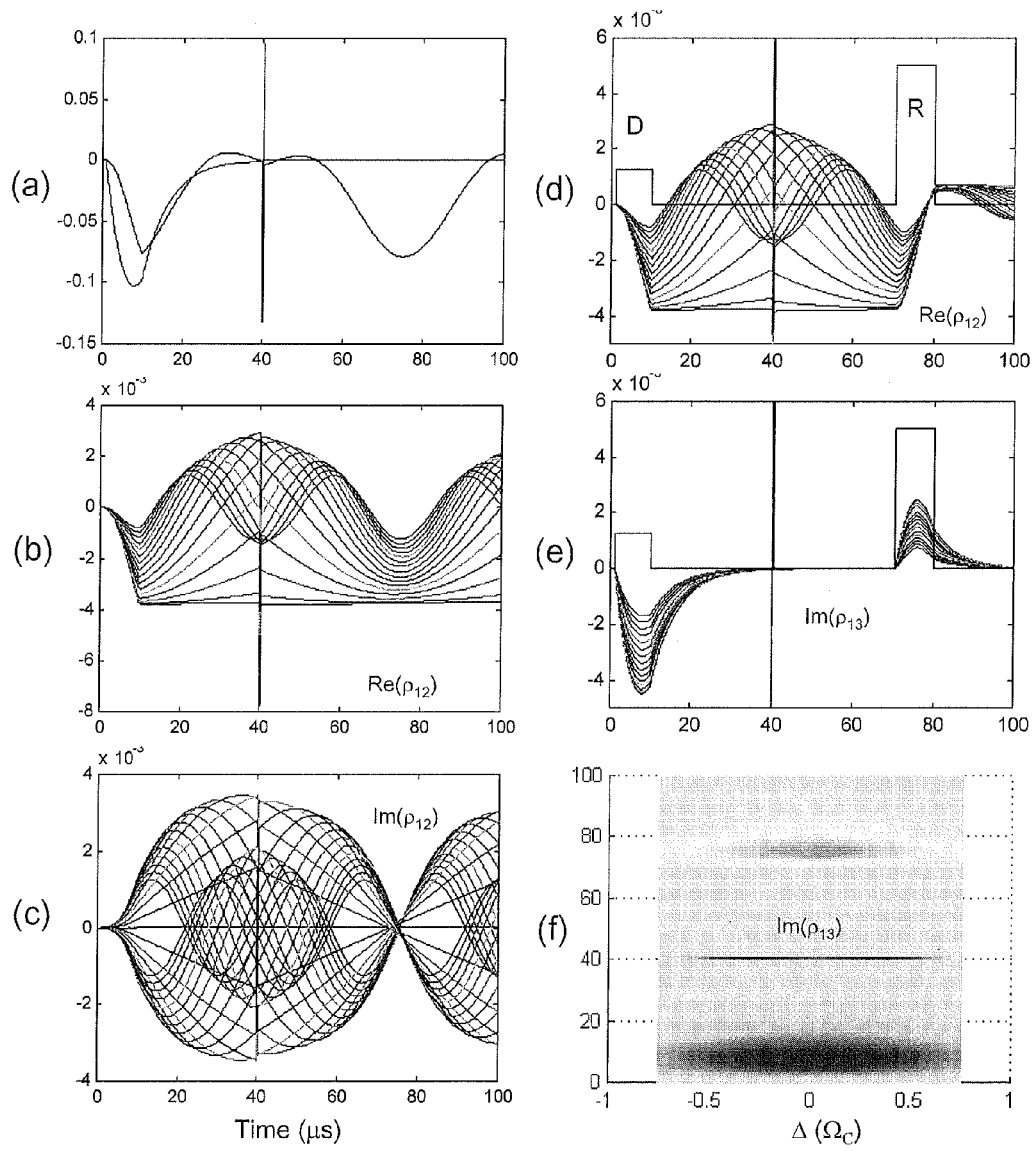
FIG. 6 illustrates coherence conversion process between spin coherence and optical coherence for complete quantum optical data retrieval.

As seen in FIG. 4(d), each spin coherence is excited by each resonant Raman optical pulse, and a train of three spin coherences is retrieved by the resonant Raman rephrasing pulse. As mentioned in FIG. 3, the rephrasing procedure is time reversal, FIG. 4(d) demonstrate time reversal pattern for the spin coherence rephrasing process. In FIG. 4, the retrieval efficiency is exponentially drops down as the rephrasing pulse delays (see FIGS. 4(e) and (f)). The decay time fits into exponential curve with the spin phase decay time (T2S=180 μs). For the rephrasing process, FIG. 4(f) presents pulse width dependent spin coherence phase evolution. In FIG. 4(f), 6 p rephrasing pulse area is applied, i.e., 200 ns forms π pulse area. For the first p pulse area, the curve (i) and (ii) are for symmetric spins (imaginary parts) detuned by ±10 kHz. The curve (iii) is for real component of the spin coherence. Like in FIG. 1h, the rephrasing pulse induces phase reversal to the imaginary parts of the spin coherence, FIG. 4f demonstrates out of phase at each 2π pulse area. Thus, the rephrasing pulse area Φ must satisfy to make time reversal process:

$$\Phi_n=2\pi+4n\pi, \text{ where n is integer.} \quad (2)$$

Figure 5:
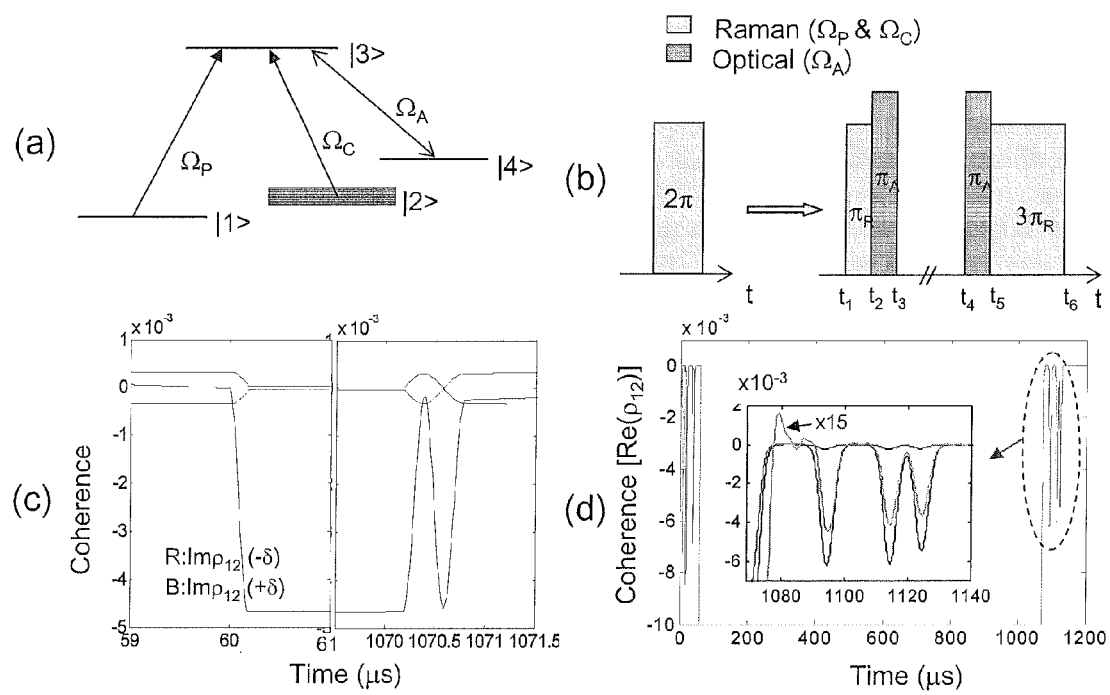
FIG. 5 illustrates a protocol spin population decay time-limited quantum optical data storage according to the present invention.

Now we propose a novel method of the storage time extension from a conventional short spin phase decay time to the spin population decay time. Especially rare-earth doped solids have an ultralong spin population decay time from several minutes (Pr:YSO) to several hours (Eu:YSO). FIG. 5(a) shows energy level diagram of this method. In comparison with the energy level diagram in FIG. 4, an extra ground state |4> is added. The state |4> is an isolated state from the ground states |1> and |2>. Without this isolated state, any excited atoms should decay down to |1> and |2>, causing coherence leakage.

To avoid from such coherence leakage due to population decay, an isolated state is needed to store the excited atoms for a while. This storage time is actually as long as the spin population decay time of several hours. To transfer the excited atoms an extra optical field is also needed. The pulse sequence is shown in FIG. 5(b). Similarly stimulated photon echo method, the rephrasing pulse is divided into two parts. The first part is for spin phase locking, and the second one is for optical decay locking as well as phase reverse as done in FIGS. 2 and 3.

In FIG. 5(b) the pulse sequence of πR-πA-πA-3πR stands for the protocol of quantum optical data storage whose storage time is not limited by the conventional spin phase decay time but limited by spin population decay time.

FIG. 5(c) demonstrates phase reversal based on FIG. 5(b). The first part of πR-πA-πA-3πR pulse sequence in FIG. 5b is used for π/2 phase change as shown in FIG. 5(c) for t1 (60.0 μs)<t<t3 (60.2 μs). The second part of the π-π-π-3π pulse sequence reverses the phase of Im(ρ12) for t4(1070 μs)<t<t6 (1070.6 μs). In more detail, the optical π-π pulses of ΩA makes population invariant on level |3>, but reverses the spin coherence phase as shown in FIG. 5c: see the phase difference between t=t3 and t=t4. Because of this π phase shift, the last Raman pulse area Φ2R needs another p in addition to the 2π in FIG. 2(f):

$$\Phi_{2R}=3\pi+4n\pi, \text{ where n is inerger.} \quad (3)$$

FIG. 5(d) presents an ultralong quantum optical data storage, where the storage time is much longer than the conventional spin phase decay time. All simulation parameters are same as experimental values except zero spin phase decay rate during the πÃ-πA pulse sequence in FIG. 5(b). When the first Raman rephrasing pulse πR comes, it rotate the uv plane (the uv plane is a complex plane made of Re(ρ12) and Im(ρ12)) by 90 degrees. In this case the dephasing phenomenon by the spin phase decay rate of the spin coherence on the ground state spins is frozen. However the excited atoms (spins) on the excited state |3> is not. Thus the excited atoms need to be locked. This is done by the first πA optical pulse. The important thing for this optical locking, the auxiliary state |4> must be isolated from the ground states. Thus, three consecutive quantum optical pulses are stored for longer time until spin population decay time. Even for unbalanced data pulses (ΩP=ΩC/100, green curve), the retrieval efficiency is near perfect like balanced case (blue curve). This is very important to the quantum information, where a single photon or a few photons are used as an optical pulse.

So far we have discussed how to excite spin coherences, how to store it, and how to retrieve it. The retrieved signal is still spin coherence burst, not optical one. Thus it needs to convert the spin coherence into optical one to complete the present quantum optical data storage and retrieval.

FIG. 6 present coherence conversion process using EIT-enhanced nondegenerate four-wave mixing processes. FIG. 6(a) is a resonant Raman pulse excited spin coherence and coherence retrieval by a 2π rephrasing pulse as shown in FIGS. 1~3: FIG. 6(a) is for sum of all spins, and FIGS. 6(b) and 6(c) are for individual spins. The red curve in FIG. 6(a) is for optical coherence Im(ρ13). FIG. 6(d) is for coherence conversion by applying read out pulse. This coherence conversion process is well explained by Ham in Opt. Exp. (2008). The optical readout pulse in FIG. 6(d) converts the spin coherence into the optical one as seen in FIG. 6(e). Here it should be noted that the amount of the spin coherence depleted in FIG. 6(d) is converted into the optical one in FIG. 6(e). FIG. 6(f) shows 2-D optical coherence for both absorption (blue color) and emission (red color) of FIG. 6(e).

Figure 7:
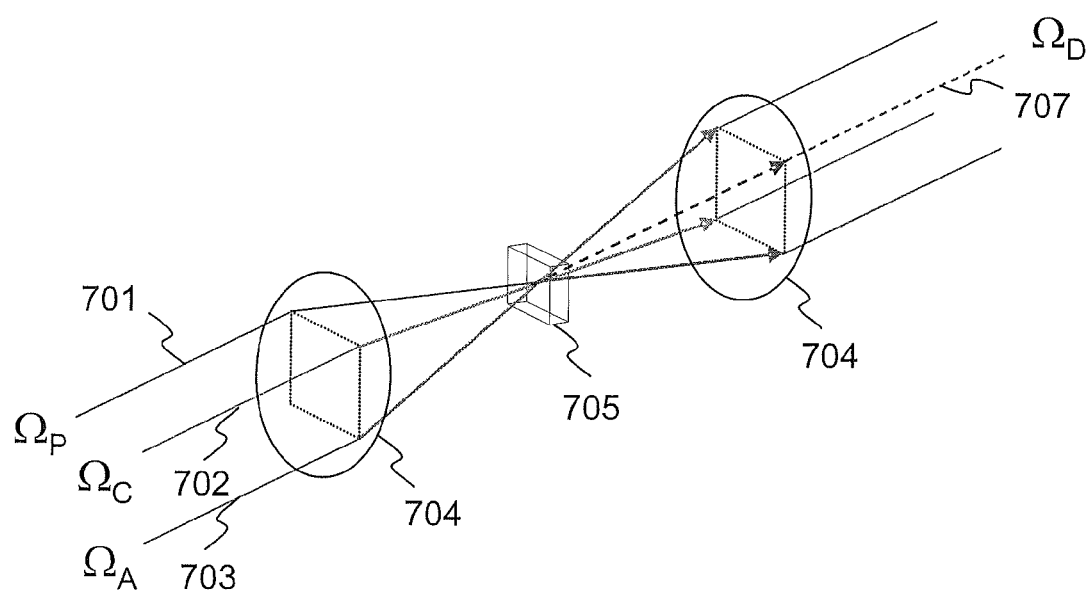
FIG. 7 illustrates an apparatus of the present invention of spin population decay time-limited quantum optical data storage based on spin inhomogeneous broadening.

FIG. 7 illustrates a specific apparatus of the present invention, spin population decay time limited quantum optical data storage. The three laser inputs 701, 702, and 703 in FIG. 7 stand for the laser inputs 101, 102, and 103 in FIG. 1 respectively.

The optical medium 705 stands for 104 in FIG. 1. The output 707 stands for 105 in FIG. 1, respectively. The input laser beams are focused and collimated through a lens 704. The output beam ΩD, 707 exists only when the control beam ΩA, 703 turns on). The ΩD is four-wave mixing generation read by the ΩA, where coherence conversion renders near perfect quantum optical retrieval process.

Here it should be noted that the slow factor of the input pulse P, 701 is determined by adjusting the coupling pulse intensity of C1, 702. To play a coherence conversion process the readout pulse ΩA, 703 must synchronize to the retrieved spin coherence burst.

It will also be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

What is claimed is:

1. A quantum data storage, comprising:
a nonlinear optical medium configured to include:
a first ground state and a second ground state which are closely spaced to each other in energy level or degenerated and to forbid two-photon transitions between the first and second ground states;
an excited state which has a spin inhomogeneous broadening and to allow two-photon transitions between the first ground state and the second ground state via the excited state and allow a spin coherence;
an auxiliary state for forbidding two-photon transitions between the first and second ground states via the auxiliary state and allowing a transition from/to the excited state;
wherein a spin coherence induced by a transition of two photons from the first ground state and the second state to the excited state is transited to the auxiliary state so that a phase decay of the spin coherence is prevented and data is stored as the phase of the spin coherence; and
a laser emitter configured to emit a laser beam for allowing at least one of a transition between the first ground state and the excited state, a transition between the second ground state and the excited state, and a transition between the excited state and the auxiliary state.

2. A quantum data storage, comprising:
a nonlinear optical medium configured to include:
a first ground state and a second ground state which are closely spaced to each other in energy level or degenerated and to forbid two-photon transitions between the first and second ground states;
an excited state which has a spin inhomogeneous broadening and to allow two-photon transitions between the first ground state and the second ground state via the excited state thereby to produce a spin coherence;
an auxiliary state for forbidding two-photon transitions between the first and second ground states via the auxiliary state and allowing a transition from/to the excited state;
wherein the spin coherence in the auxiliary state is transited to the excited state and to the first and second ground state such that a phase of the spin coherence is retrieved and a light is emitted as data to be read; and
a laser emitter configured to emit a laser beam for allowing at least one of a transition between the first ground state and the excited state, a transition between the second ground state and the excited state, and a transition between the excited state and the auxiliary state.

3. A method for writing data in a quantum data storage comprising a nonlinear optical medium,
the nonlinear optical medium including a first ground state and a second ground state which are closely spaced to each other in energy level or degenerated and to forbid two-photon transitions between the first and second ground states, an excited state which has a spin inhomogeneous broadening and to allow two-photon transitions between the first ground state and the second ground state via the excited state thereby to produce a spin coherence, an auxiliary state for forbidding two-photon transitions between the first and second ground states via the auxiliary state and allowing a transition from/to the excited state;
and the method comprising:
a) applying, to the nonlinear optical medium, a first laser beam having a first frequency corresponding to the transition from the first ground state to the excited state, and a second laser beam having a second frequency corresponding to the transition from the second ground state to the excited state such that the transitions produce a spin coherence;
b) applying, to the nonlinear optical medium, a third laser beam having a third frequency corresponding to a transition from the excited state to the auxiliary state, wherein a phase decay of the spin coherence is prevented and data is stored as the phase of the spin coherence.

4. The method of claim 3, wherein the first laser beam and the second laser beam correspond to a resonant Raman pulse.

5. The method of claim 3, wherein the first and second laser beams are simultaneously applied.

6. The method of claim 3, wherein
the second laser beam has a specific intensity for producing nearly even spin coherence at the excited state having the spin inhomogeneous broadening.

7. The method of claim 3, wherein
an energy level of the excited state is higher than the energy levels of the first and second ground states.

8. The method of claim 3, wherein
the second laser beam is modulated to synchronize and spatially overlap with the first laser beam.

9. A method for reading data from a quantum data storage comprising a nonlinear optical medium,
the nonlinear optical medium including a first ground state and a second ground state which are closely spaced to each other in energy level or degenerated and to forbid two-photon transitions between the first and second ground states, an excited state which has a spin inhomogeneous broadening and to allow two-photon transitions between the first ground state and the second ground state via the excited state thereby to produce a spin coherence, an auxiliary state for forbidding two-photon transitions between the first and second ground states via the auxiliary state and allowing a transition from/to the excited state;
and the method comprising:
a) applying, to the nonlinear optical medium, a third laser beam having a third frequency corresponding to the transition from the auxiliary state to the excited, wherein a phase of a spin coherence reserved in the auxiliary state is retrieved;
b) applying, to the nonlinear optical medium, a first laser beam having a first frequency corresponding to the transition from the excited state to the first ground state, and a second laser beam having a second frequency corresponding to the transition from the excited state to the second ground state;
c) applying, to the nonlinear optical medium, the second laser beam such that a nondegenerate four-wave mixing signal is emitted; and
d) analyzing the nondegenerate four-wave mixing wave corresponding to the data to be read.

10. The method of claim 9, wherein a pulse area of the first laser beam and the second laser beam is adjusted to retrieve the spin coherence.

11. The method of claim 9, wherein an intensity of the third laser beam is adjusted to produce the pulse area $\pi$.

12. The method of claim 9, wherein the first laser beam and the second laser beam correspond to a resonant Raman pulse.

13. The method of claim 9, wherein the first and second laser beam are simultaneously applied.

14. The method of claim 9, wherein
an energy level of the excited state is higher than the energy levels of the first and second ground states.

15. The method of claim 9, wherein
the second laser beam is modulated to synchronize and spatially overlap with the first laser beam.

16. A quantum data storage, comprising:
a nonlinear optical medium including a first ground state and a second ground state which are closely spaced to each other in energy level or degenerated and to forbid two-photon transitions between the first and second ground states, an excited state which has a spin inhomogeneous broadening and to allow two-photon transitions between the first ground state and the second ground sate via the excited state thereby to produce a spin coherence, an auxiliary state for forbidding two-photon transitions between the first and second ground states via the auxiliary state and allowing a transition from/to the excited state;
a first controlling unit for controlling applying a first laser beam having a first frequency corresponding to the transition between the first ground state and the excited state;
a second controlling unit for controlling applying a second laser beam having a second frequency corresponding to the transition between the second ground state and the excited state;
a third controlling unit for controlling applying a third laser beam having a third frequency corresponding to the transition between the excited state and the auxiliary state;
wherein a spin coherence produced from a transition of two photons from the first ground state and the second state to the excited state by appliance of the first laser beam and the second laser beam is transited to the auxiliary state so that a phase decay of the spin coherence is prevented and data is stored as the phase of the spin coherence, and
wherein the spin coherence in the auxiliary state is transited to the excited state and to the first and second ground state by appliance of the third laser beam such that a phase of the spin coherence is retrieved and the spin coherence is transited to the first and second ground states by appliances of the first laser beam and second laser beam such that a four-wave mixing signal is produced as data to be read.

17. The storage of claim 16, wherein an intensity of the third laser beam is adjusted by the pulse area $\pi$ to rephase the spin coherence.

* * * * *